United States Patent
Sekiguchi

(10) Patent No.: US 7,068,978 B2
(45) Date of Patent: Jun. 27, 2006

(54) CURRENT CELL TYPE DIGITAL-TO-ANALOG CONVERTER

(75) Inventor: Masaru Sekiguchi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 416 days.

(21) Appl. No.: 10/692,940

(22) Filed: Oct. 27, 2003

(65) Prior Publication Data

US 2004/0212523 A1 Oct. 28, 2004

(30) Foreign Application Priority Data

Apr. 22, 2003 (JP) .............................. 2003-116996

(51) Int. Cl.
*H04B 1/40* (2006.01)
*H03M 1/66* (2006.01)

(52) U.S. Cl. .................. 455/74; 341/126; 341/144
(58) Field of Classification Search .............. 455/42, 455/74, 93; 341/126, 135, 136, 144, 146
See application file for complete search history.

(56) References Cited

U.S. PATENT DOCUMENTS

| | | | | |
|---|---|---|---|---|
| 5,162,800 A | * | 11/1992 | Ogawara | 341/144 |
| 5,574,455 A | * | 11/1996 | Hori et al. | 341/144 |
| 6,275,179 B1 | * | 8/2001 | Mori | 341/144 |
| 6,346,901 B1 | * | 2/2002 | Aiura et al. | 341/135 |
| 6,683,549 B1 | * | 1/2004 | Kinugasa | 341/136 |

FOREIGN PATENT DOCUMENTS

| | | |
|---|---|---|
| JP | 01-19474 | 1/1989 |
| JP | 01-268316 | 10/1989 |
| JP | 04-042619 | 2/1992 |
| JP | 05-191290 | 7/1993 |
| JP | 11-17545 | 1/1999 |

OTHER PUBLICATIONS

Japanese Office Action for Application No. JP-2003-116996 dated Jul. 20, 2004.

* cited by examiner

*Primary Examiner*—Quochien B. Vuong
(74) *Attorney, Agent, or Firm*—Nixon Peabody LLP; Donald R. Studebaker

(57) ABSTRACT

The current cell matrix includes 63 upper current cells and one lower current cell. Each of the current cells has 4 constant current transistors having the same size with respect to each other. The upper current cell outputs drain currents of all the constant current transistors when the cell is selected by the upper decoder. The lower current cell outputs drain currents of none, one or two constant current transistors in accordance with the select signal from the lower decoder. The analog output terminal combines and outputs the currents of the selected constant current cells. The current cell type digital-to-analog converter has the decreased differential linearity error and the decreased integral linearity error.

20 Claims, 4 Drawing Sheets

CURRENT CELL TYPE DIGITAL-TO-ANALOG CONVERTER

BACKGROUND OF THE INVENTION

1) Field of the Invention

The present invention relates to a digital-to-analog converter which converts a digital signal into an analog current by using a plurality of current cells.

2) Description of the Related Art

Current cell type digital-to-analog converters are known in the art. Such digital-to-analog converter has a capability to convert a digital signal into an analog current by using a plurality of current cells. The current cell type digital-to-analog converter is disclosed in, for example, Japanese Patent Kokai No.11-17545.

When, for example, the current cell type digital-to-analog converter has a 6-bit resolution, the current values having 64 levels from 0 level to $2^6-1$ level are usually set up. In order to set up such levels, the digital-to-analog converter having the 6-bit resolution includes 63 current cells. Accordingly, when the current cells are turned on in such a manner that the number of turned-on current cells corresponds to a digital value, an electrical current corresponding to such digital value can be output.

The current cell type digital-to-analog converter disclosed in the above mentioned Japanese Patent Kokai No.11-17545 includes 63 current cells weighted by 4, one current cell weighted by 2, one current cell weighted by 1, one current cell weighted by ½ and one current cell weighted by ¼ (see FIG. 1 of Japanese Patent Kokai No.11-17545). The current cells weighted by 4 are arranged in a matrix pattern. On the other hand, the other weighted current cells are not arranged in a matrix pattern, because only one cell is assigned for each weight. Each current cell is connected to a power supply line VCC (see FIG. 2 of Japanese Patent Kokai No.11-175453). Each current cell outputs an electrical current supplied from the power supply line VCC when the cell is selected by a decoder. When the electrical current output from the current cell weighted by 1 is Io, the electrical current output from the current cell weighted by 4 is 4Io, the electrical current output from the current cell weighted by 2 is 2Io, the electrical current output from the current cell weighted by ½ is Io/2, and the electrical current output from the current cell weighted by ¼ is Io/4. Combining the current cells which are weighted differently with respect to each other provides an increased resolution in the digital-to-analog converter without using a number of current cells.

It is difficult to sufficiently expand the width of the power supply line when a number of current cells are provided in one digital-to-analog converter, because of an area restriction and other restrictions. Accordingly, when a large number of current cells are connected to one power supply line, an influence of a voltage drop due to a resistance of the power supply line can not be ignored.

It is preferable for the digital-to-analog converter that the output current increases Io by Io upon an increment of the digital value by 1. As mentioned earlier, Io represents the electrical current output from the current cell weighted by 1. However, such increments of the electrical current usually fluctuate in a practical situation due to fluctuation in the output currents of the current cells. Therefore, a conventional current cell type digital-to-analog converter has a drawback of bad differential nonlinearity.

SUMMARY OF THE INVENTION

An object of the present invention is to provide a current cell type digital-to-analog converter which has excellent digital-to-analog conversion characteristics with a simple structure.

According to a first aspect of the present invention, there is provided a current cell type digital-to-analog converter including a current cell matrix including a plurality of upper current cells and at least one lower current cell so as to form a matrix pattern, in which all of the current cells have the same number of constant current transistors connected in parallel, and the constant current transistors are the same size, an upper control circuit provided within each of the upper current cells for outputting currents of all the constant current transistors within the upper current cell when the upper current cell is selected, at least one lower control circuit provided within each of the at least one lower current cell for outputting only current of a predetermined number of constant current transistors within the lower current cell when the lower current cell is selected, a plurality of power supply lines respectively provided in rows of the current cell matrix so that each power supply line supplies currents to the constant current transistors provided in the upper current cell and the lower current cell provided in the corresponding row, an upper decoder for selecting none or at least one of the upper control circuits in accordance with predetermined one or more upper bits of a digital value, a lower decoder for selecting none or at least one of the lower control circuits in accordance with predetermined one or more lower bits of the digital value, and an analog output terminal for outputting a summation of output currents of the upper current cells and the at least one lower current cell.

According to the current cell type digital-to-analog converter, not only the upper current cells, which are the current cells weighted by the maximum values, but also the lower current cell is allocated within the matrix so that both of the upper current cells and the lower current cell are provided within the same matrix. Accordingly, an influence of a voltage drop due to an electrical resistance of the power supply line can be decreased.

Therefore, the current cell type digital-to-analog converter having excellent digital-to-analog conversion characteristics can be provided with a simple structure.

DETAILED DESCRIPTION OF THE INVENTION

Figure 1:
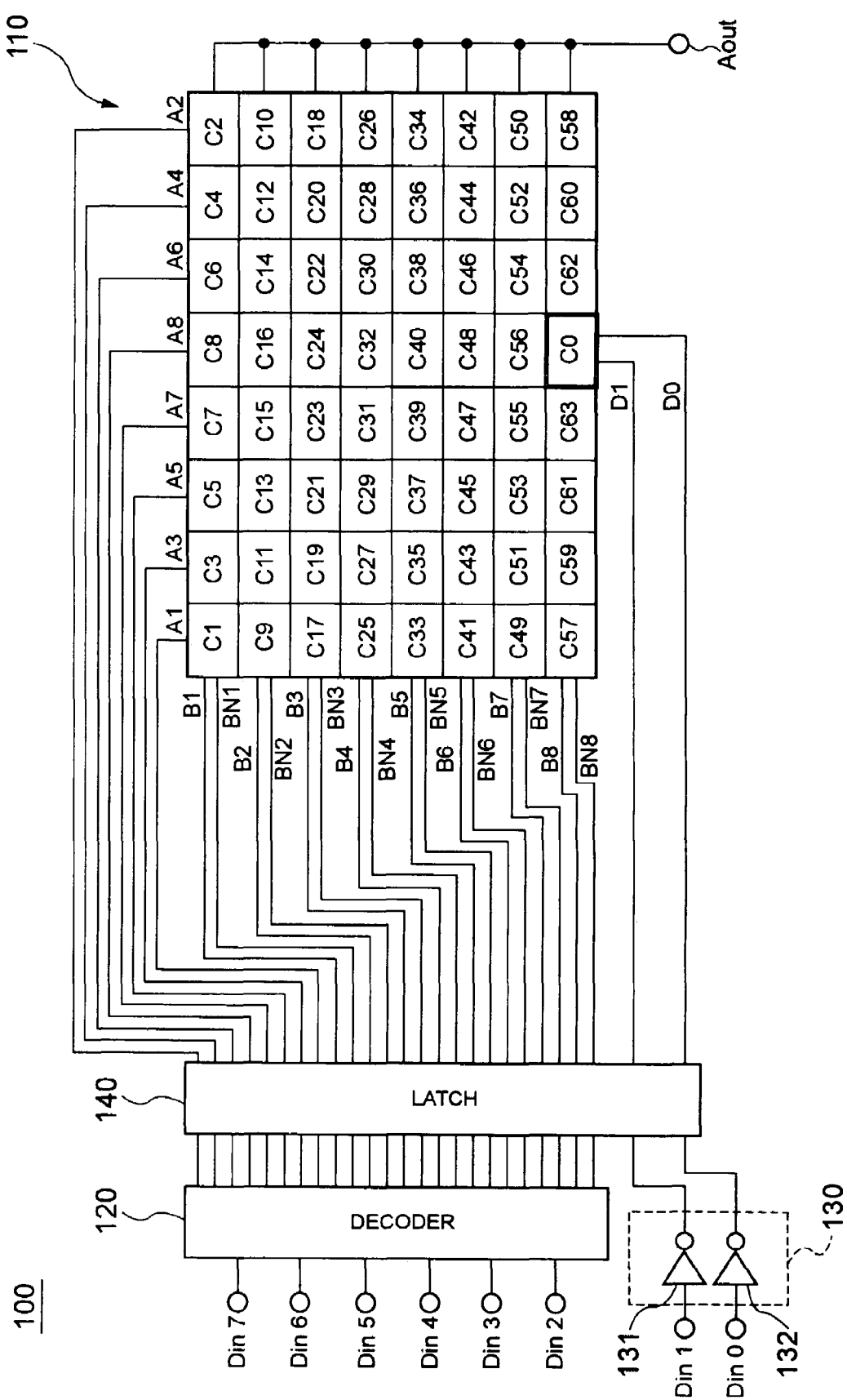
FIG. 1 is a block diagram schematically showing a structure of a current cell type digital-to-analog converter according to an embodiment of the present invention.

An embodiment of the present invention will be hereinafter described with reference to the drawings. It should be noted that size, shape and positional relationship of components in the drawings are schematically shown to an extent for understanding the present invention, and that numerical conditions described below are merely shown for the purpose of exemplification.

Figure 2:
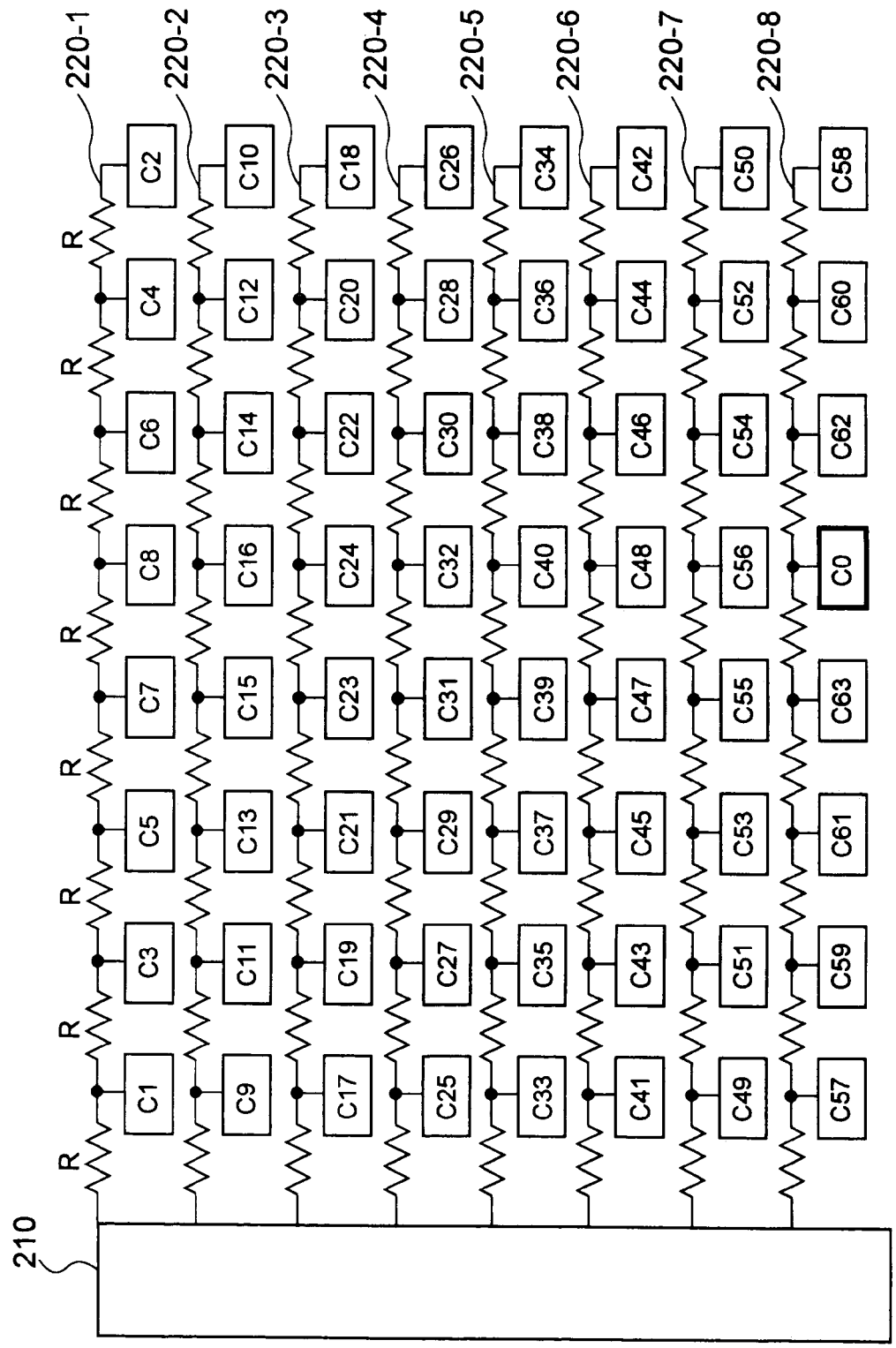
FIG. 2 is a circuit diagram showing wiring of power supply lines for the current cell type digital-to-analog converter shown in FIG. 1.

As shown in FIGS. 1 and 2, the current cell type digital-to-analog converter 100 includes a current cell matrix 110, an upper decoder 120, a lower decoder 130, a latch 140, select signal lines for upper current cells A1 to A8, B1 to B8, and BN1 to BN8, select signal lines for lower current cell D0 and D1, digital input terminals Din0 to Din7, an analog output terminal Aout, a power supply pattern 210, and power supply lines 220-1 to 220-8.

The current cell matrix 110 includes 63 upper current cells C1 to C63 and one lower current cell C0 (the eighth row and the fifth column). As can be understood from FIGS. 1 and 2, not only the upper current cells C1 to C63 but also the lower current cell C0 are allocated within the current cell matrix 110 so as to form a matrix pattern in the current cell type digital-to-analog converter 100 according to the embodiment of the present invention.

The upper decoder 120 receives upper six bits of a digital signal from the digital input terminals Din2 to Din7. Subsequently, the upper decoder 120 generates and outputs select signals for the upper current cells in accordance with values of these bits.

The lower decoder 130 receives lower two bits of the digital signal from the digital input terminals Din0 and Din1. Subsequently, the lower decoder 130 generates and outputs select signals for the lower current cell in accordance with values of these bits. In the embodiment, the select signals for the lower current cell are generated by inverting the lower two bits of the digital signal at inverters 131 and 132.

The latch 140 latches select signals which are output from the decoders 120 and 130, and outputs the select signals to the select signal lines A1 to A8, B1 to B8, BN1 to BN8, and D0 and D1.

The select signal lines A1 to A8 are signal lines used to select columns of the upper current cells. The select signal lines B1 to B8 and BN1 to BN8 are used to select rows of the upper current cells. Whereas the select signal lines D0 and D1 are signal lines used to select the lower current cell.

The digital input terminals Din0 to Din7 receive digital signals from, for example, an external circuit.

The analog output terminal Aout is connected to current output terminals (not shown in FIGS. 1 and 2) of all the current cells. Consequently, a combined output current, which is a combination of output currents from the selected current cells, is output from the analog output terminal Aout.

The power supply pattern 210 is a wiring pattern which supplies power supply currents to each of integrated circuits within a chip (the current cell matrix 110). Since the power supply pattern 210 has an expanded width, the pattern has sufficiently low electrical resistance. Accordingly, an influence of a voltage drop can be ignored.

The power supply lines 220-1 to 220-8 are respectively provided along rows of the current cell matrix. Accordingly, the power supply lines 220-1 to 220-8 supply currents from the power supply pattern 210 to respective rows of the current cells C0 to C63. It is impossible to form the power supply lines 220-1 to 220-8 with sufficiently expanded widths because of an area restriction of the current cell matrix. Therefore, the electrical resistance can not be ignored. In the embodiment, electrical resistances between the power supply pattern 210 and the upper current cells in the first column, as well as electrical resistances between the adjacent upper current cells, are respectively defined as R.

Although the resistance values are only shown in the first row in FIG. 2, the other rows have the same resistance values.

Figure 3:
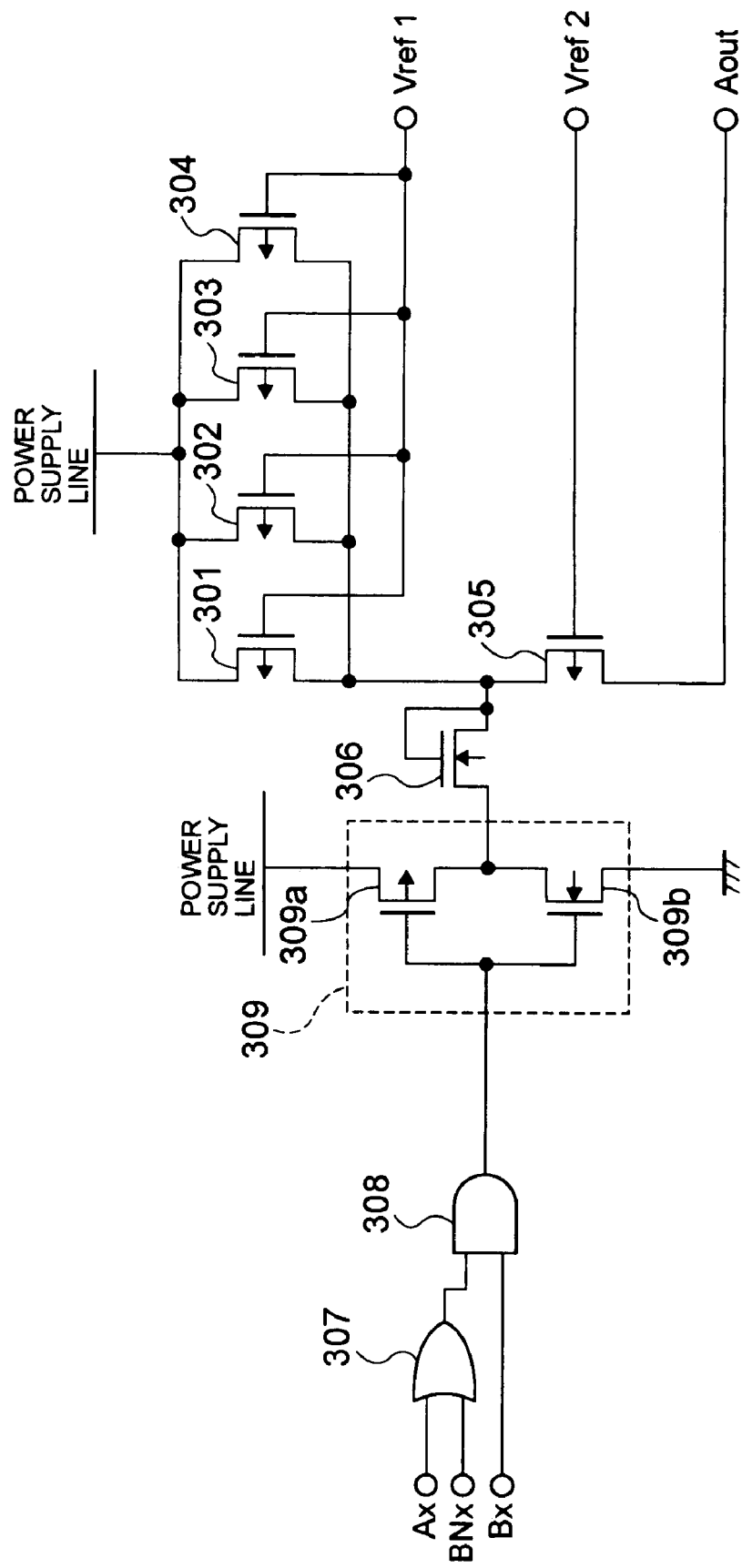
FIG. 3 is a circuit diagram showing an internal structure of an upper current cell used in the converter shown in FIG. 1.

FIG. 3 is a circuit diagram showing an internal structure of each of the upper current cells C1 to C63. As shown in FIG. 3, each of the upper current cells C1 to C63 includes constant current pMOS transistors 301 to 304, a gating pMOS transistor 305, a diode-connected nMOS transistor 306, an OR gate 307, an AND gate 308 and an inverter 309.

The constant current PMOS transistors 301 to 304 are formed so as to have the same size, and are connected in parallel with respect to each other. Each source of the pMOS transistors 301 to 304 is connected to the corresponding power supply line (one of the power supply lines 220-1 to 220-8 shown in FIG. 2). A first reference potential Vref1 (fixed electric potential) is applied to the gates of the pMOS transistors 301 to 304.

The source of the gating pMOS transistor 305 is connected to the drains of the pMOS transistors 301 to 304. A second reference potential Vref2 (fixed electrical potential) is applied to the gate of the pMOS transistor 305. The drain of the PMOS transistor 305 is connected to the analog output terminal Aout.

The drain and the gate of the diode-connected nMOS transistor 306 are connected to each drain of the pMOS transistors 301 to 304. The source of the transistor 306 is connected to the output node of the inverter 309.

The OR gate 307 outputs a logical sum of the corresponding column select signal line Ax (one of A1 to A8 shown in FIG. 1) and the row select signal line BNx (one of BN1 to BN8 shown in FIG. 1).

The AND gate 308 outputs a logical product of the corresponding row select signal line Bx (one of B1 to B8 shown in FIG. 1) and the output signal from the OR gate 307.

The inverter 309 inverts the output signal from the AND gate 308, and supplies the inverted signal to the source of the nMOS transistor 306. The inverter 309 has a CMOS (Complementary MOS) structure, which includes a pMOS transistor 309a and an nMOS transistor 309b.

Figure 4:
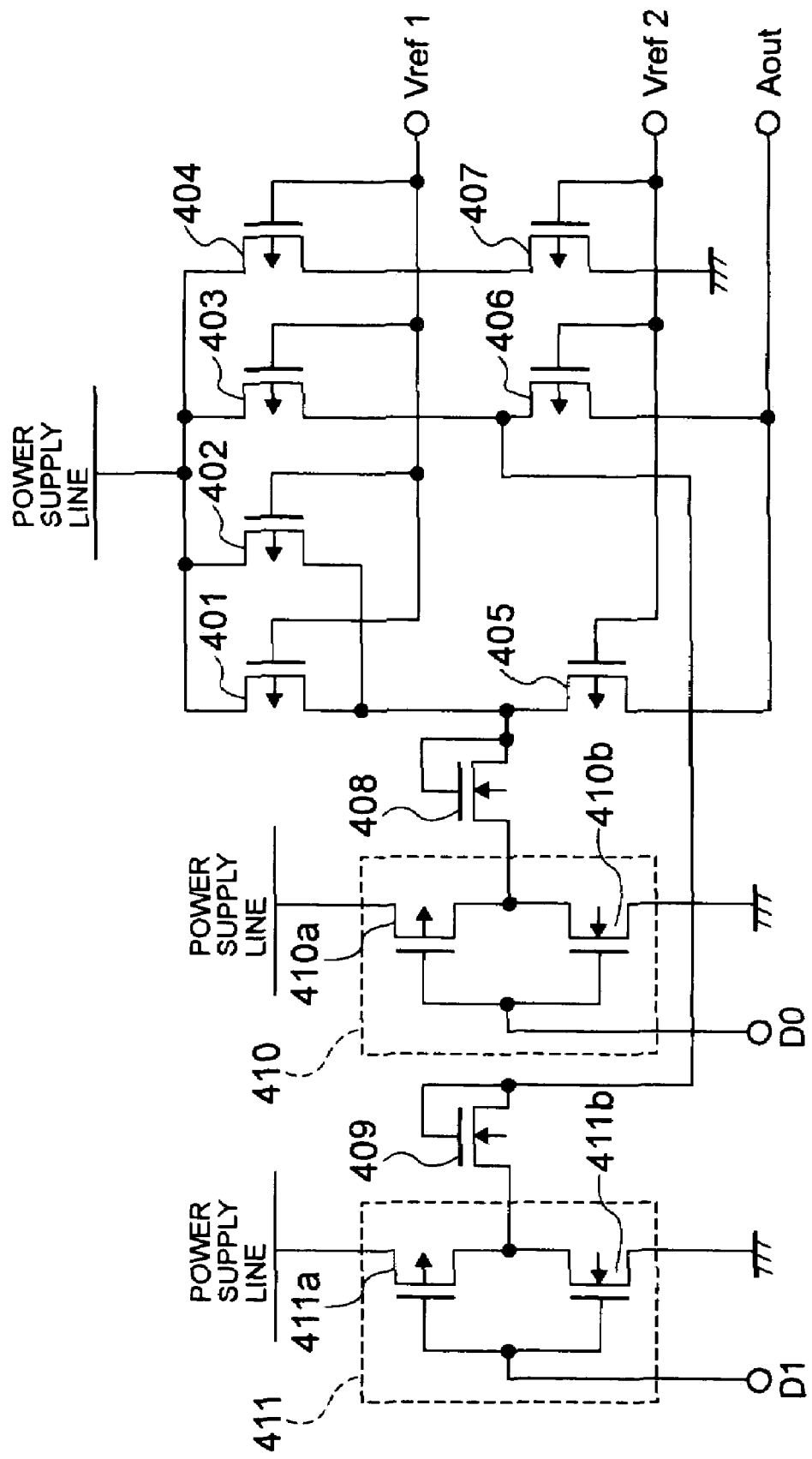
FIG. 4 is a circuit diagram showing an internal structure of a lower current cell used in the converter shown in FIG. 1.

FIG. 4 is a circuit diagram showing an internal structure of the lower current cell C0. As shown in FIG. 4, the lower current cell C0 includes constant current pMOS transistors 401 to 404, gating pMOS transistors 405 to 407, diode-connected nMOS transistors 408 and 409, and inverters 410 and 411.

The constant current pMOS transistors 401 to 404 are formed so as to have the same size as the constant current pMOS transistors 301 to 304 of the upper current cells (see FIG. 3). Each source of the pMOS transistors 401 to 404 is connected to the corresponding power supply line (the power supply line 220-8 shown in FIG. 2). The first reference potential Vref1 is applied to the gates of the pMOS transistors 401 to 404.

The source of the gating pMOS transistor 405 is connected to the drains of the pMOS transistors 401 and 402. The second reference potential Vref2 is applied to the gate of the pMOS transistor 405. The drain of the pMOS transistor 405 is connected to the analog output terminal Aout.

The source of the gating pMOS transistor 406 is connected to the drain of the pMOS transistor 403. The second reference potential Vref2 is applied to the gate of the pMOS transistor 406. The drain of the pMOS transistor 406 is connected to the analog output terminal Aout.

The source of the gating pMOS transistor 407 is connected to the drain of the pMOS transistor 404. The second reference potential Vref2 is applied to the gate of the pMOS transistor 407. The drain of the pMOS transistor 407 is connected to the ground line, and is not connected to the analog output terminal Aout.

The drain and the gate of the diode-connected nMOS transistor 408 are connected to each drain of the pMOS transistors 401 and 402. The source of the transistor 408 is connected to the output node of the inverter 410.

The drain and the gate of the diode-connected nMOS transistor 409 are connected to the drain of the pMOS transistor 403. The source of the transistor 409 is connected to the output node of the inverter 411.

The inverter 410 inverts the signal received through the lowest bit select signal line D0 (see FIG. 1), and supplies the inverted signal to the source of the nMOS transistor 408. The inverter 410 has the CMOS structure, which includes a pMOS transistor 410a and an nMOS transistor 410b.

The inverter 411 inverts the signal received through the second bit select signal line D1 (see FIG. 1), and supplies the inverted signal to the source of the nMOS transistor 409. The inverter 411 has the CMOS structure, which includes a pMOS transistor 411a and an nMOS transistor 411b.

The operation of the current cell type digital-to-analog converter 100 according to the embodiment will be hereinafter described.

Firstly, a principle of operation of the upper current cells C1 to C63 will be described.

As shown in FIG. 3, the fixed reference potential Vref1 is always applied to the gates of the constant current pMOS transistors 301 to 304. Accordingly, these pMOS transistors 301 to 304 are always turned on. Likewise, the fixed reference potential Vref2 is always applied to the gating pMOS transistor 305. Accordingly, the pMOS transistor 305 is always weakly turned on.

The inverter 309 receives the output voltage from the logical circuit including the gates 307 and 308. When the signal on the row select signal line Bx is at the low level, the output signal from the AND gate 308 is at the low level regardless of the signal values on the row select signal line BNx and the column select signal line Ax. Accordingly, the inverter 309 outputs the high level signal. In this instance, the current does not flow through the diode-connected transistor 306 since the cathode potential is at the high level. Consequently, the drain currents of the pMOS transistors 301 to 304 are supplied to the analog output terminal Aout via the transistor 305. Four transistors, i.e., the pMOS transistors 301 to 304 which are defined as the transistors for supplying the output currents, contribute to supplying the currents to the analog output terminal Aout. Since the PMOS transistors 301 to 304 are formed so as to have the same size as described above, the drain currents are the same with respect to each other. Therefore, the current supplied to the analog output terminal Aout is 4Io (ideal value), on condition that each of the drain currents of the pMOS transistors 301 to 304 is Io.

When the signal on the row select signal line Bx is at the high level and the signal on the row select signal line BNx is at the low level, the level of the output signal from the AND gate 308 is the same as the level of the signal on the column select signal line Ax. When the signal on the column select signal line Ax is at the high level, the output signal from the inverter 309 is at the low level. Consequently, the drain currents of the pMOS transistors 301 to 304 flow to the ground via the transistors 306 and 309b. Therefore, the drain currents of the pMOS transistors 301 to 304 are not supplied to the analog output terminal Aout. On the other hand, when the signal on the column select signal line Ax is at the low level, the output signal from the inverter 309 is at the high level. Consequently, the current 4Io is supplied to the analog output terminal Aout from the pMOS transistors 301 to 304 via the transistor 305.

When both of the signals on the row select signal lines Bx and BNx are at the high level, the output signal from the inverter 309 is at the low level, regardless of the signal value on the column select signal line Ax. Consequently, the drain currents of the pMOS transistors 301 to 304 flow to the ground via the transistors 306 and 309b. Therefore, the drain currents of the PMOS transistors 301 to 304 are not supplied to the analog output terminal Aout.

Next, a principle of operation of the lower current cell C0 will be described.

As shown in FIG. 4, the fixed reference potential Vref1 is always applied to the gates of the constant current pMOS transistors 401 to 404. Accordingly, these pMOS transistors 401 to 404 are always turned on. Likewise, the fixed reference potential Vref2 is always applied to the gating pMOS transistors 405 to 407. Accordingly, the pMOS transistors 405 to 407 are always weakly turned on.

When the signal on the select signal line D0 is at the high level, the output signal from the inverter 410 is at the low level. Consequently, the drain currents of the pMOS transistors 401 and 402 flow to the ground via the transistors 408 and 410b. Therefore, the drain currents of the pMOS transistors 401 and 402 are not supplied to the analog output terminal Aout. On the other hand, when the signal on the select signal line D0 is at the low level, the output signal from the inverter 410 is at the high level. In this instance, the current does not flow through the diode-connected transistor 408 since the cathode potential is at the high level. Consequently, the drain currents of the pMOS transistors 401 and 402 are supplied to the analog output terminal Aout via the transistor 405. Only two pMOS transistors 401 and 402 contribute to supplying the currents to the analog output terminal Aout. Therefore, the current supplied to the analog output terminal Aout is one-half of that of the upper current cells C1 to C63, i.e., 2Io (ideal value).

When the signal on the select signal line D1 is at the high level, the output signal from the inverter 411 is at the low level. Consequently, the drain current of the pMOS transistor 403 flows to the ground via the transistors 409 and 411b. Therefore, the drain current of the pMOS transistor 403 is not supplied to the analog output terminal Aout. On the other hand, when the signal on the select signal line D1 is at the low level, the output signal from the inverter 411 is at the high level. In this instance, current does not flow through the diode-connected transistor 409 since the cathode potential is at the high level. Consequently, the drain current of the pMOS transistor 403 is supplied to the analog output terminal Aout via the transistor 406. Only one pMOS transistor 403 contributes to supplying the current to the analog output terminal Aout. Therefore, the current supplied to the analog output terminal Aout is a quarter of that of the upper current cells C1 to C63, i.e., Io (ideal value).

The drain current Io of the pMOS transistor 404 is always discharged to the ground via the gating transistor 407. The pMOS transistor 404 is a dummy transistor which is provided for equalizing the current supplied from the power supply line 220-8 to the lower current cell C0 with the current 4Io. The current 4Io is the current supplied to the upper current cells C1 to C63. Provision of such dummy transistor decreases the differential nonlinearity of the digital-to-analog converter 100, which will be described later.

Next, an overall operation of the digital-to-analog converter 100 will be described.

The digital signals are supplied to the digital input terminals Din0 to Din7 as described above. The upper decoder 120 generates the select signals for the upper current cells by using the upper six bits of the digital signal. The select signals are supplied to the select signal lines A1 to A8, B1 to B8, and BN1 to BN8 from the latch 140.

In this embodiment, an order of priority for selecting the upper current cells is C1, C2, ..., and C63. For example, when only one upper current cell is energized, the upper current cell C1 is always selected. When only two upper current cells are energized, the upper current cells C1 and C2 are always selected. When only eight upper current cells are energized, all the upper current cells in the first row, i.e., C1 to C8, are always selected. As shown in FIGS. 1 and 2, when a plurality of upper current cells are simultaneously selected within the same row, the current cells are picked up alternately from both ends of the row. For example, when a plurality of upper current cells are selected within the first row (the row is connected to the power supply line 220-1), the priority order of the cells to be selected is the cell in the first column C1, the cell in the eighth column C2, the cell in the second column C3, the cell in the seventh column C4, and so on. Furthermore, when the number of selected cells is 9 to 16, the upper current cells in the first row and the second row are always selected in this embodiment. In a similar manner, when the number of selected cells is 17 to 24, the upper current cells in the first row to the third row are always selected. When the number of selected cells is 25 or more, the upper current cells belonging to the upper rows are selected according to the priority of the selection.

In order to achieve the above priorities, when all of the upper current cells belonging to the same row are selected, the row select signal line Bx corresponding to the row is set at the low level. When no upper current cell within the row is selected, the row select signal lines Bx and BNx corresponding to such row are set at the high levels. On the other hand, when some upper current cells in a row are selected but the other upper current cells within the same row are not selected, the corresponding row select signal line Bx is set at the high level, and the corresponding row select signal line BNx is set at the low level. When the row select signal lines Bx and BNx are set at the high level and the low level, respectively, as described above, whether selecting the upper current cell or not is determined based on the signal level of the column select signal line Ax.

For example, when 30 upper current cells are selected, the row select signal lines B1 to B3 are set at the low level, and the row select signal lines B4 to B8 are set at the high level. Furthermore, the row select signal lines BN1 to BN3 remain at an arbitrary level, the row select signal line BN4 is set at the low level, and the row select signal lines BN5 to BN8 are set at the high level. In addition, the column select signal lines A1 to A6 are set at the high level, and the other column select signal lines A7 and A8 are set at the low level. Consequently, the upper current cells C1 to C30 are selected, and the upper current cells C31 to C63 are not selected.

The lower decoder 130 generates the select signals for the lower current cell by using the lower two bits of the digital signal. The select signals are supplied to the select signal lines D0 and D1 from the latch 140. The output current of the lower current cell C0 is 3Io (ideal value) when both D0 and D1 are at the low level, it is 2Io (ideal value) when D0 is at the low level and D1 is at the high level, it is Io (ideal value) when D0 is at the high level and D1 is at the low level, and it is zero when both D0 and D1 are at the high level.

When none of the current cells C0 to C63 is selected, the output current of the analog output terminal Aout is zero. On the other hand, when all the current cells C0 to C63 are selected, the output current of the analog output terminal Aout is 255Io (ideal value), which is a summation of the output current of the lower current cell C0, i.e., 3Io, and the output currents of the upper current cells C1 to C63, i.e., 63×4Io. In this embodiment, accordingly, the digital-to-analog converter 100 can have the output currents with variations of 256 levels in the analog output terminal Aout.

As described above, when a plurality of upper current cells are simultaneously selected within the same row, the current cells are alternately selected from both ends of the row. Furthermore, the lower current cell is allocated in the last row corresponding to the power supply line 220-8, and in the fifth column, in the embodiment. The reason for the above configuration will be hereinafter described.

As described above, because the power supply pattern 210 has an expanded width, the pattern with a sufficiently low electrical resistance is provided. Accordingly, the influence of the voltage drop can be ignored. On the other hand, because the power supply lines 220-1 to 220-8 have high electrical resistances, the influence of the voltage drop can not be ignored. In the embodiment, the electrical resistances between the power supply pattern 210 and the upper current cells in the first column, as well as the electrical resistances between the adjacent upper current cells, are defined as R, as described above (see FIG. 2).

The electrical current which flows through the power supply line 220-1 between the power supply pattern 210 and the upper current cell C1 is 8×4Io, i.e., 32Io. Accordingly, the voltage drop through the section is 32Io·R. When the electric potential of the power supply pattern 210 is VDD, the electric potential at the inlet of the first column upper current cell C1, which is the source potential of the pMOS transistors 301 to 304 in FIG. 3, is VDD−32Io·R. The electrical current which flows through the power supply line 220-1 between the upper current cells C1 and C2 is 7×4Io, i.e., 28Io. Accordingly, the voltage drop through the section is 28Io·R. Therefore, the electric potential at the inlet of the second column upper current cell C3 is (VDD−32Io·R)−28Io·R, i.e., VDD−60Io·R. In a similar manner, the electric potential at the inlet of the third column upper current cell C5 is VDD−84Io·R, the electric potential at the inlet of the fourth column upper current cell C7 is VDD−104Io·R, the electric potential at the inlet of the fifth column upper current cell C8 is VDD−120Io·R, the electric potential at the inlet of the sixth column upper current cell C6 is VDD−134Io·R, the electric potential at the inlet of the seventh column upper current cell C4 is VDD−142Io·R, and the electric potential at the inlet of the eighth column upper current cell C2 is VDD−146Io·R. As can be understood by the above, among the electric potentials at the inlets of the current cells C1 to C8 which are provided within the first row, the electric potential at the inlet of the first column upper current cell C1 is the highest, and the electric potential at the inlet of the eighth column upper current cell C2 is the lowest. Therefore, among the electrical currents supplied from the power supply line 220-1 to the upper current cells C1 to C8, the electrical current supplied to the first column upper current cell C1 is the largest, and the electrical current supplied to the eighth column upper current cell C2 is the smallest, although it is ideal that all the electrical currents supplied to the upper current cells are 4Io. The above characteristic is similar to that of other rows corresponding to the power supply lines 220-2 to 220-8. Accordingly, in order to linearize the relationship between the number of selected upper current cells and the output current of the analog output terminal Aout as much as possible, namely, in order to decrease the integral linearity error, it is preferable to alternately select the current cells from both ends of the row, when a plurality of upper current cells are simultaneously selected within the same row. Therefore, it is not preferable to select the current cells in accordance with the column order, i.e., the first column, the second column and so on.

As described above, in the embodiment, the less weighted current cells are combined to form the lower current cell C0, and the lower current cell C0 is positioned at the eighth row and the fifth column of the current cell matrix 110. Moreover, the dummy constant current transistor 404 is provided within the lower current cell C0 so that the lower current cell C0 includes the same number of constant current transistors as the upper current cells C1 to C63 include. Consequently, the electric potential at the inlet of the lower current cell C0 is VDD−120Io·R, which is similar to those of the upper current cells at the fifth column in other rows, i.e., C8, C16, . . . , C56. Therefore, each value of drain currents of the constant current transistors 401 to 404 provided in the lower current cell C0 is close to an average value of the drain currents of the constant current transistors 301 to 304 in the upper current cells C1 to C63. This configuration decreases the integral linearity error when the lower current cell C0 is selected. Furthermore, since the electric potential at the inlet of the lower current cell C0 is VDD−120Io·R, the electric potentials at the inlets of the upper current cells which are at lower-order positions than the lower current cell C0, i.e., C62, C60 and C58, are the same as the electrical potentials at the inlets of the upper current cells which are respectively positioned in the same columns in other rows, e.g., C6, C4 and C2. It should be noted that the position of a current cell is referred to as a lower-order position when the current cell is positioned further from the power supply pattern 210 in this embodiment. Consequently, providing the lower current cell C0 does not affect the electrical characteristics of the upper current cells which are at lower-ordered positions than the lower current cell C0, i.e., C62, C60 and C58. In addition, in the embodiment, the lower current cell C0 is positioned at the fifth column of the current cell matrix. The upper current cells at the fifth column in the first to seventh row are selected last among the cells in the same row. Consequently, the procedures to select the upper current cells in the eighth row, i.e., C57 to C63, are the same as those in the first to seventh rows.

It should be noted that when the inverters 309, 410 or 411 (see FIGS. 3 and 4) are turned on, the currents are supplied to the corresponding current cells C0 to C63 so as to increase the source potentials of the respective diode-connected transistors 306, 408 or 409. However, the currents can be ignored as the current value is very small.

Furthermore, although the current cell matrix 110 in the embodiment includes only one lower current cell C0, the current cell matrix may include more than one lower current cells.

As described above, the digital-to-analog converter 100 according to the embodiment can decrease the differential linearity error and the integral linearity error without complicating the circuit structure or the control method.

This application is based on a Japanese patent application No. 2003-116996 which is herein incorporated by reference.

What is claimed is:

1. A current cell type digital-to-analog converter comprising:
    a current cell matrix including a plurality of upper current cells and at least one lower current cell so as to form a matrix pattern, in which all of the current cells have the same number of constant current transistors connected in parallel, and the constant current transistors are the same size;
    an upper control circuit provided within each of the upper current cells for outputting currents of all the constant current transistors within the upper current cell when the upper current cell is selected;
    at least one lower control circuit provided within each of the at least one lower current cell for outputting only current of a predetermined number of constant current transistors within the lower current cell when the lower current cell is selected;
    a plurality of power supply lines respectively provided in rows of the current cell matrix so that each power supply line supplies currents to the constant current transistors provided in the upper current cell and the lower current cell provided in the corresponding row;
    an upper decoder for selecting none or at least one of the upper control circuits in accordance with predetermined one or more upper bits of a digital value;
    a lower decoder for selecting none or at least one of the lower control circuits in accordance with predetermined one or more lower bits of the digital value; and
    an analog output terminal for outputting a summation of output currents of the upper current cells and the at least one lower current cell.

2. The current cell type digital-to-analog converter according to claim 1, wherein the at least one lower control circuit of each of the at least one lower current cell includes a plurality of lower control circuits, and the plurality of lower control circuits cause the constant current transistors of the lower current cell concerned to output different number of currents.

3. The current cell type digital-to-analog converter according to claim 1, wherein each of the at least one lower current cell includes at least one dummy constant current transistor for equalizing the number of said constant current transistors with the number of said upper current cells, and the dummy constant current transistor discharges current supplied from the power supply line to a ground line.

4. The current cell type digital-to-analog converter according to claim 1, wherein the upper decoder alternately selects the current cells from both ends of a row when a plurality of the upper current cells are simultaneously selected within the same row.

5. The current cell type digital-to-analog converter according to claim 4, wherein the at least one lower current cell is provided at a position in the last row which corresponds to the positions of the upper current cells selected last in other rows.

6. The current cell type digital-to-analog converter according to claim 1, wherein the constant current transistors are pMOS transistors.

7. The current cell type digital-to-analog converter according to claim 1, wherein the upper control circuit includes a gating pMOS transistor, a diode-connected nMOS transistor, an OR gate, an AND gate and an inverter.

8. The current cell type digital-to-analog converter according to claim 1, wherein the lower control circuit includes a plurality of gating PMOS transistors, a plurality of diode-connected nMOS transistors, and a plurality of inverters.

9. The current cell type digital-to-analog converter according to claim 7, wherein the inverter has a CMOS structure.

10. The current cell type digital-to-analog converter according to claim 8, wherein the inverter has a CMOS structure.

11. The current cell type digital-to-analog converter according to claim 1 further including a latch which latches select signals output from the upper decoder and the lower decoder.

12. The current cell type digital-to-analog converter according to claim 11, wherein the latch supplies one column select signal and two row select signals to each of the upper current cells via respective select signal lines, and supplies a plurality of select signals to each of the at least one lower current cell via respective select signal lines.

13. A current cell type digital-to-analog converter comprising:
    matrix means including a plurality of upper current cells and at least one lower current cell so as to form a matrix pattern, in which all of the current cells have the same number of constant current transistors connected in parallel, and the constant current transistors are the same size;
    first means provided within each of the upper current cells for outputting currents of all the constant current transistors within the upper current cell when the upper current cell is selected;
    at least one second means provided within each of the at least one lower current cell for outputting only current of a predetermined number of constant current transistors within the lower current cell when the lower current cell is selected;
    a plurality of third means respectively provided in rows of the matrix means so that each third means supplies currents to the constant current transistors provided in the upper current cell and the lower current cell provided in the corresponding row;
    fourth means for selecting none or at least one of the first means in accordance with predetermined one or more upper bits of a digital value;
    fifth means for selecting none or at least one of the second means in accordance with predetermined one or more lower bits of the digital value; and
    sixth means for outputting a summation of output currents of the upper current cells and the at least one lower current cell.

14. The current cell type digital-to-analog converter according to claim 13, wherein the at least one second means of each of the at least one lower current cell includes a plurality of second means, and the plurality of second means cause the constant current transistors of the lower current cell concerned to output different number of currents.

15. The current cell type digital-to-analog converter according to claim 13, wherein each of the at least one lower current cell includes at least one dummy constant current transistor for equalizing the number of said constant current transistors with the number of said upper current cells, and the dummy constant current transistor discharges current supplied from the third means to a ground line.

16. The current cell type digital-to-analog converter according to claim 13, wherein the fourth means alternately selects the current cells from both ends of a row when a plurality of the upper current cells are simultaneously selected within the same row.

17. The current cell type digital-to-analog converter according to claim 16, wherein the at least one lower current cell is provided at a position in the last row which corresponds to the positions of the upper current cells selected last in other rows.

18. The current cell type digital-to-analog converter according to claim 13, wherein the constant current transistors are pMOS transistors.

19. The current cell type digital-to-analog converter according to claim 13, wherein the first means includes a gating pMOS transistor, a diode-connected nMOS transistor, an OR gate, an AND gate and an inverter.

20. The current cell type digital-to-analog converter according to claim 13, wherein the second means includes a plurality of gating pMOS transistors, a plurality of diode-connected nMOS transistors, and a plurality of inverters.

* * * * *